United States Patent
Tanaka

(10) Patent No.: US 7,579,662 B2
(45) Date of Patent: Aug. 25, 2009

(54) MEMS RESONATOR AND METHOD OF ENHANCING AN OUTPUT SIGNAL CURRENT FROM A MEMS RESONATOR

(75) Inventor: Kazuaki Tanaka, Barcelona (ES)

(73) Assignee: Seiko Epson Corporation (JP)

( * ) Notice: Subject to any disclaimer, the term of this patent is extended or adjusted under 35 U.S.C. 154(b) by 178 days.

(21) Appl. No.: 11/582,946

(22) Filed: Oct. 17, 2006

(65) Prior Publication Data
US 2007/0091971 A1   Apr. 26, 2007

(30) Foreign Application Priority Data
Oct. 18, 2005   (EP)   ................................. 05022649

(51) Int. Cl.
*H01S 3/97* (2006.01)
(52) U.S. Cl. .................. 257/415; 257/416; 257/417; 257/420; 257/418; 257/419; 333/186; 333/187; 333/188; 333/189
(58) Field of Classification Search ......... 333/186–189; 257/415–420, E29.105
See application file for complete search history.

(56) References Cited

U.S. PATENT DOCUMENTS

| | | | |
|---|---|---|---|
| 6,238,946 B1 | 5/2001 | Ziegler | |
| 2005/0073078 A1 | 4/2005 | Lutz et al. | |
| 2006/0049895 A1 * | 3/2006 | Tada et al. | .................. 333/186 |

FOREIGN PATENT DOCUMENTS

EP   1585219 A1   4/2004

OTHER PUBLICATIONS

Nguyen C T-C: "Vibrating RF MEMS for Next Generation Wireless Applications" Custom Integrated Circuits Conference, 2004. Proceedings of the IEEE 2004 Orlando, FL, USA Oct. 3-6, 2004, Piscataway, NJ, USA, IEEE, Oct. 3, 2004, pp. 257-264, XP010742287 ISBN: 0-7803-8495-4.
Nguyen C T C: "Micromachining Technologies For Miniaturized Commuciation Devices" Proceedings of the SPIE, SPIE, Bellingham, VA, US, vol. 3511, Sep. 21, 1998, pp. 24-38, XP001085288, ISSN: 0277-786X.

* cited by examiner

*Primary Examiner*—Cuong Q Nguyen
*Assistant Examiner*—Trang Q Tran
(74) *Attorney, Agent, or Firm*—Harness, Dickey & Pierce, P.L.C.

(57) ABSTRACT

The resonator comprises two capacitively coupled electrodes. One of the electrodes is made of a p-type doped semiconductor material, whereas the other electrode is made of an n-type doped semiconductor material. The invention also comprises a method of using this specific selection of the doping for enhancing the output signal current from a resonator.

1 Claim, 6 Drawing Sheets

MEMS RESONATOR AND METHOD OF ENHANCING AN OUTPUT SIGNAL CURRENT FROM A MEMS RESONATOR

FIELD OF THE INVENTION

The application relates to the field of resonators and, especially, to the field of MEMS (micro-electromechanical systems) resonators.

STATE OF THE ART

Micro-electromechanical systems (MEMS) are among the most promising technologies for implementing low-cost, low-power components for, for example, radio-frequency (RF) applications. The micrometric scale of MEMS devices and the possibility of integration can be useful to reduce the problems of the large areas occupied by passive components in conventional RF systems.

In this context, so-called MEMS resonators have been developed, comprising two semiconductor electrodes (made of, for example, silicon) that are capacitively coupled. When an electrical signal is applied over the electrodes, the resonator generates a resonance signal at its resonance frequency: the electrical signal induces a mechanical vibration of a part of the electrode arrangement, for example, of one of the electrodes, which starts to oscillate, at its mechanical resonance frequency. This causes the capacitance of the electrode arrangement to change, whereby the system generates an electrical resonance signal.

Normally, in semiconductor applications, the material of the electrodes (such as silicon or polysilicon electrodes) has a polarity determined by a doping material (p-type or n-type) with which the electrodes are doped. An example of a p-type doping material is boron (B), whereas arsenic (As) and phosphorus (P) are n-type doping materials. Known capacitively coupled MEMS resonators comprise two semiconductor electrodes doped with the same material. FIG. 1 schematically illustrates such a prior art MEMS resonator, comprising two electrodes 1A, 2A, both being doped with a p-type doping material, and connected to a DC bias voltage $V_P$.

A problem frequently faced when MEMS resonators are to be used is that the output resonance signal current is very small, typically in the order of nA. A reason for this is the fact that the resonator itself is small. A further reason is that the conversion efficiency of mechanical energy into electrical energy is not very good. Thus, there is a need to increase the output resonance signal current, so as to render MEMS resonators more useful in many practical applications. Frequently, this problem has been attacked by attempts to reduce the series motional resistance. However, this is not always adequate or optimal, and/or does not always lead to a sufficient or optimal levels of the output current. Thus, it is considered that there is a need for alternative and/or complementary solutions.

U.S. Pat. No. 6,238,946 discloses a device in which electrodes may end up having not the same doping, as the dopings of the electrodes is sometimes chosen to obtain certain effects related with the specific electrodes. For example, in one example disclosed in U.S. Pat. No. 6,238,946, "n-type" doped silicon is used for a layer in order to establish isolation (by means of a junction capacitance) towards a p-doped silicon substrate, and another electrode is doped with ion implantation so as to modify the natural frequency of the resonator structure, by altering the elastic constant of the resonator. Different alternatives are given, including implantation of dopant substitutional atoms such as B (p-type), AS (n-type) and P (n-type). No importance at all is given to the type of doping of the beam electrode, the only relevant issue being the way the ions affect the local bonding of the silicon and the elastic constant of the resonator. Actually, U.S. Pat. No. 6,238,946 discloses the incorporation of this kind of materials (including both n-type and p-type materials) to modify the band-pass frequency characteristics of the resonator, and also suggest the use of carbon or germanium, which are neither n-type or p-type materials.

DESCRIPTION OF THE INVENTION

A first aspect of the invention relates to a resonator, especially a micro-electromechanical systems (MEMS) resonator, comprising two capacitively coupled electrodes, each electrode being made of a semiconductor material. The electrodes are arranged on a dielectric layer (for example, a silicon dioxide layer) separating said electrodes from an underlying silicon layer. One of the electrodes is made of a p-type doped semiconductor material, whereas the other electrode is made of an n-type doped semiconductor material. Thereby, the output signal current can be increased, as explained below:

The electric charge per unit between semiconductor electrodes of a MEMS resonator can be calculated as $$q = C_o(V_P - V_{FB} - 2\phi_f)$$

$$V_{FB} = \phi_{AB}$$

(where $C_0$ is the static capacitance between the two electrodes, $V_P$, is a DC bias voltage between the two electrodes, $V_{FB}$ is the flat-band voltage, $\Phi_f$ is the Fermi potential, and $\Phi_{AB}$ is the built-in potential between two semiconductor electrodes arranged such as in FIG. 1).

In conventional arrangements, wherein both electrodes consist of material doped in the same way, (that is, or p-type and p-type, or n-type and n-type semiconductor materials, as shown in FIG. 1), the built-in potential $\Phi_{AB}$ is $$\phi_{AB} = \frac{E_g}{2} - \frac{kT}{2}\ln\left(\frac{N_a}{n_i}\right)$$

(where $E_g$ is the energy band-gap of the semiconductor, $N_a$ is the doping density of the bottom side (reference) semiconductor electrode, k is Boltzman constant, T is temperature, and $n_i$ is intrinsic density of semiconductor). Then, the electric charge of the electrode is:

$$q_1 = C_o(V_P - (\phi_{AB}) - 2\phi_f)$$
$$= C_o\left(V_P - \left(\frac{E_g}{2} - \frac{kT}{2}\ln\left(\frac{N_a}{n_i}\right)\right) - 2\phi_f\right)$$
$$= C_0\left(V_P - \frac{E_g}{2} + \frac{kT}{2}\ln\left(\frac{N_a}{n_i}\right) - 2\phi_f\right)$$

However, if the electrodes are made up of differently doped materials (for example, of a p-type and n-type semiconductor material, respectively), the built-in potential $\Phi_{AB}$ will be $$\phi_{AB} = -\frac{E_g}{2} - \frac{kT}{2}\ln\left(\frac{N_a}{n_i}\right)$$

Then, the electric charge of the electrode will be $$q_2 = C_o(V_P - (\phi_{AB}) - 2\phi_f)$$
$$= C_0\left(V_P - \left(-\frac{E_g}{2} - \frac{kT}{2}\ln\left(\frac{N_a}{n_i}\right)\right) - 2\phi_f\right)$$
$$= C_0\left(V_P + \frac{E_g}{2} + \frac{kT}{2}\ln\left(\frac{N_a}{n_i}\right) - 2\phi_f\right)$$

From above formulae, the difference of the charge of the electrodes, that is, the difference between $q_1$ and $q_2$, can be determined:

$$q_2 - q_1 = C_0\left(V_P + \frac{E_g}{2} + \frac{kT}{2}\ln\left(\frac{N_a}{n_i}\right) - 2\phi_f\right) -$$
$$\left(C_0\left(V_P - \frac{E_g}{2} + \frac{kT}{2}\ln\left(\frac{N_a}{n_i}\right) - 2\phi_f\right)\right)$$
$$= C_0 E_g$$

Thus, it can be observed that a resonator having one electrode made of a p-type semiconductor material and the other electrode made of an n-type semiconductor material, will be able to accumulate electric charge to a larger extent than the prior art resonators in which both electrodes are doped in the same way.

Considering a capacitive MEMS resonator having, at the resonance frequency, an impedance $R_x$; the resonator will generate an output signal current that can be calculated as:

$$i_o = V_P \cdot \left|\frac{\partial C}{\partial x}\right| \cdot \frac{\partial x}{\partial t} \cong V_P \cdot \left(\frac{\varepsilon_0 A_0}{d_0^2}\right) \cdot (\omega_0 X)$$

where $A_0 = LW$ is the resonator overlap area (cf. FIG. 3 below), $d_0$ is the gap spacing between the two electrodes, $\partial C/\partial x$ is the change of resonator capacitance per unit displacement, X is the amplitude of vibration, and $\omega_0 = 2\pi f_0$ is the radian resonance frequency, and $\varepsilon_0$ is dielectric constant.

The static capacitance of resonator is $$C_0 = \frac{q}{V_P} = \frac{\varepsilon_0 A_0}{d_0}$$

Thus, $$i_o \cong V_P \cdot \left(\frac{\varepsilon_0 A_0}{d_0}\right) \cdot \left(\frac{1}{d_0}\right) \cdot (\omega_0 X)$$
$$= V_P \cdot \frac{q}{V_P} \cdot \left(\frac{1}{d_0}\right) \cdot (\omega_0 X)$$
$$= \frac{q}{d_0} \cdot (\omega_0 X)$$

The resonator output signal is proportional to electronic charge. Thus, the semiconductor electrodes of a capacitive coupling resonator, consisting of a p-type semiconductor electrode and an n-type semiconductor electrode, can generate a larger output signal current than a resonator which has two semiconductor electrodes doped in the same way.

Thus, the resonator characteristics are improved, and the resonator is made more suitable for use in, for example, radio frequency applications, such as in integrated circuits for use in wireless communication devices. Further, the invention does not imply any need for adding any special manufacturing steps or for substantially modifying the conventional manufacturing processes. In other words, standard semiconductor manufacturing processes can be used. Thus, the invention can be implemented directly in existing technologies, without any additional costs.

The electrodes can be arranged so that at least one of them can vibrate at a resonance frequency when an electrical signal is applied to the resonator.

The material can be selected so that each electrode is made of doped silicon or polysilicon (the possibility to use polysilicon is considered to be important for many practical implementations of the invention).

One electrode can be doped with a p-type doping material such as boron (B), whereas the other electrode can be doped with an n-type doping material such as arsenic (As) and/or phosphorous (P).

A second one of said electrodes can comprise at least one beam part extending over at least a portion of a first one of said electrodes, substantially in parallel with said portion of said first one of said electrodes, thus establishing a resonator area. This resonator could correspond to a so-called MEMS microflap resonator. The resonator area can have a length (L) and a width (W) and it can be substantially square or rectangular.

The second one of the electrodes can comprise a support (anchor) part, and the beam part extending from said support part, the beam part being displaced from the first electrode, in a direction perpendicular to a major surface of the beam part. The beam part can have a fixed end and a movable end, and be arranged to vibrate or swing around the fixed end, for example, around the point where it is attached to the support part.

Instead of one single beam part, the second electrode can comprise a plurality of beam parts, for example, substantially identical beam parts, arranged in parallel.

The electrodes can be separated by a strip of dielectric material, for example, in a plane housing the first electrode and part of the support part of the second electrode.

The resonator can be produced by a standard CMOS process, such as a bulk CMOS process, which for many applications can be more commercial and cheaper than, for example, an SOI (Silicon-On-Insulator) wafer. Also, a bulk CMOS process for producing the resonator can be advantageous, as it, inter alia, allows for direct integration of the resonator into standard bulk CMOS integrated circuits.

Another aspect of the invention relates to an integrated circuit for a radio frequency (RF) application, such as an integrated circuit for use in a wireless communication device. The circuit comprises a plurality of circuit elements including at least one resonator according to the first aspect of the invention.

A further aspect of the invention relates to a method of using, in the production of a resonator, two different types of doping for two capacitively coupled electrodes, for enhancing or increasing an output signal current from the resonator comprising the two capacitively coupled electrodes, each electrode being made of a semiconductor material.

The method comprises the steps of:
selecting a p-type doped semiconductor material for one of said electrodes, and an n-type doped semiconductor material for another one of said electrodes; and
producing the resonator, using the selected p-type doped semiconductor material for one of the electrodes, and the selected n-type doped semiconductor material for another of the electrodes.

What has been stated in connection with the resonator is also applicable to the method, mutatis mutandis.

For example:

the resonator can be a micro-electromechanical systems (MEMS) resonator having one electrode arranged to vibrate at a resonance frequency when an electrical signal is applied to the resonator;

the materials used for the electrodes can comprise doped silicon and/or polysilicon;

a material doped with boron (B) can selected for one of the electrodes, and a material doped with arsenic (As) and/or phosphorous (P) can be selected for another one of the electrodes.

The method can comprise the step of arranging at least one of the electrodes so that it can vibrate at a resonance frequency when an electrical signal is applied to the resonator.

A second one of said electrodes can be produced so as to comprise at least one beam part extending over at least a portion of a first one of said electrodes, substantially in parallel with said portion of said first one of said electrodes, so as to establish a resonator area, that can have a length and a width.

The second one of said electrodes can be produced so as to comprise a support part, said at least one beam part extending from said support part, said at least one beam part being displaced from the first electrode in a direction perpendicular to a major surface of the beam part.

Said at least one beam part can produced so as to comprise a plurality of beam parts (210) arranged in parallel.

The electrodes can be produced so as to be separated by a strip of dielectric material.

The electrodes can be produced on a dielectric layer separating said electrodes from an underlying silicon layer. This implies that the resonator structure is completely separated from the silicon substrate, and not only by a p-n junction as sometimes used in prior art; such a p-n junction can cause a parasitic capacitance to substrate and, thus reducing the performance of the resonator. Said dielectric layer can be a silicon dioxide layer.

The resonator can be produced using a standard CMOS process, such as a bulk CMOS process, as mentioned above.

Another aspect of the invention relates to a method of producing an integrated circuit for a radio frequency application, comprising the step of producing a plurality of circuit elements, at least one of said circuit elements being a resonator as described above.

BRIEF DESCRIPTION OF THE DRAWINGS

To complete the description and in order to provide for a better understanding of the invention, a set of drawings is provided. Said drawings form an integral part of the description and illustrate a preferred embodiment of the invention, which should not be interpreted as restricting the scope of the invention, but just as an example of how the invention can be embodied. The drawings comprise the following figures.

DESCRIPTION OF A PREFERRED EMBODIMENT OF THE INVENTION

Figure 1:
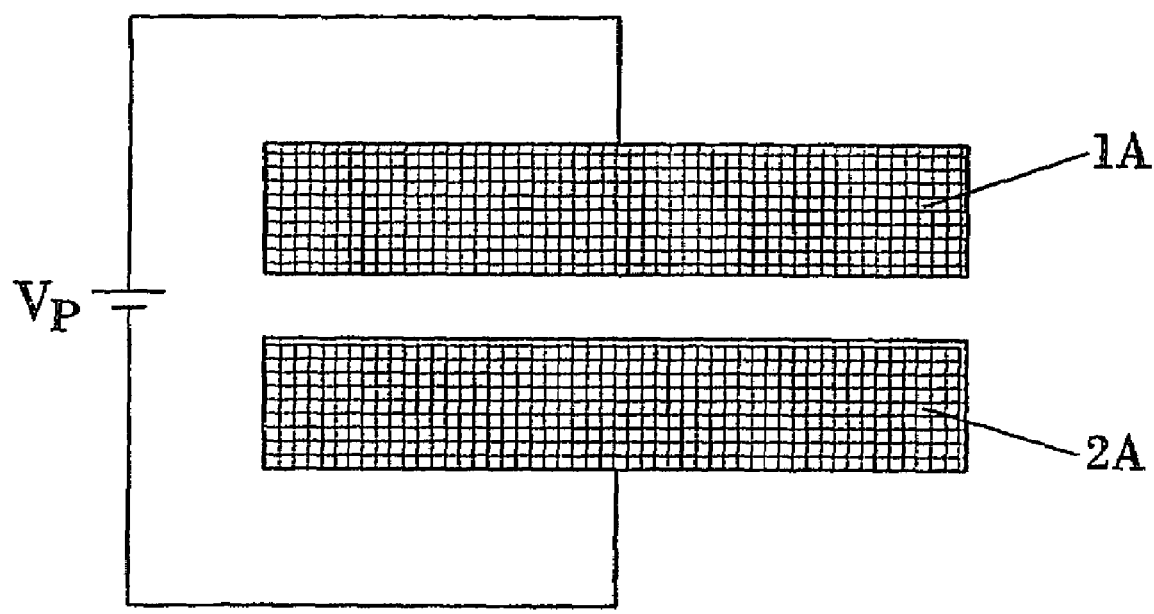
FIG. 1: a schematic view of a cross section of a prior art MEMS resonator.
Figure 2:
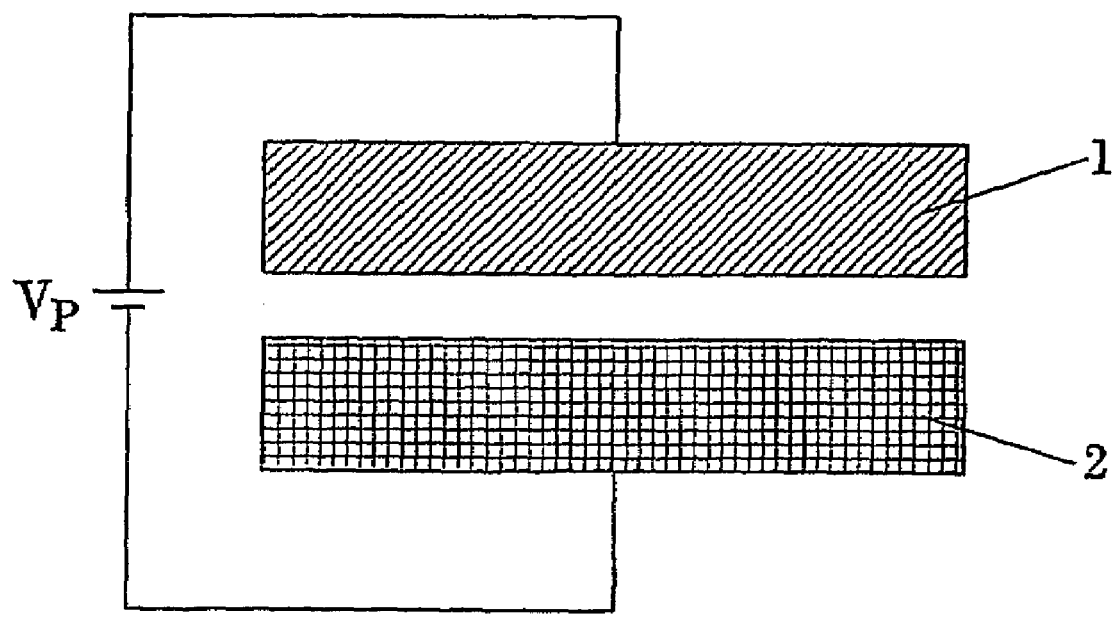
FIG. 2: a schematic view of a cross section of a MEMS resonator in accordance with an embodiment of the invention.

FIG. 2 schematically illustrates a basic embodiment of the invention, namely, the two electrodes 1 and 2 of a capacitively coupled MEMS resonator, wherein electrode 1 is made of a semiconductor material (such as silicon or polysilicon) doped with an n-type doping material (such as As or P), whereas the other electrode 2 comprises silicon or polysilicon doped with a p-type doping material, such as B. The DC bias voltage source $V_P$, is illustrated; it could also be inverted.

Figure 3:
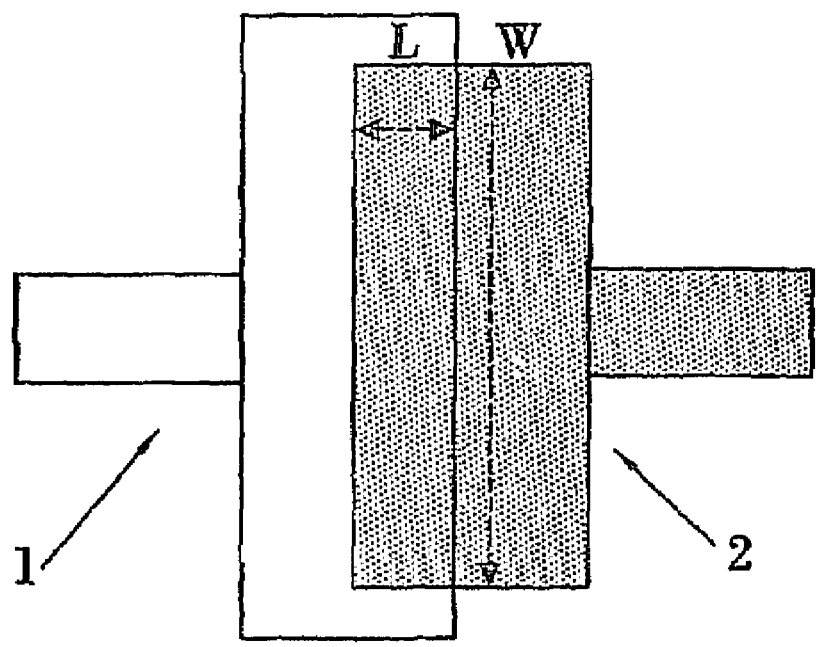
FIG. 3: a top view of a MEMS resonator in accordance with an embodiment of the invention.
Figure 4:
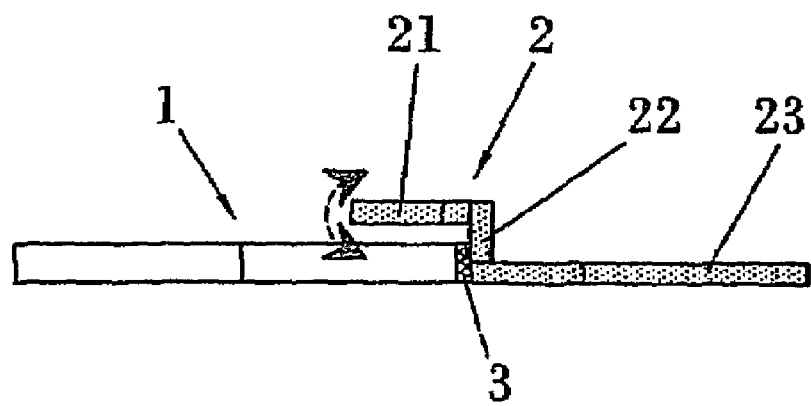
FIG. 4: a cross section view of the MEMS resonator of FIG. 3.

FIGS. 3 and 4 illustrate one possible configuration of the electrodes, wherein the first electrode 1 and the second electrode 2 are arranged so that they are separated by a strip 3 of dielectric material (such as a silicon oxide strip in the plane of the first electrode. One of the electrodes is n-doped, and the other is p-doped, as outlined above. The illustrated resonator is a so-called micro-flap resonator, and the second electrode 2 comprises a beam part 21 extending from a support part 22, over at least a part of a surface of the first electrode 1, in a manner that allows the beam part to vibrate (as illustrated schematically with the arrow in FIG. 4). At the opposite end of the support part 22 there is a base part 23 extending in a direction opposite to the direction of the beam part 21.

The electrodes can typically be made of silicon or polysilicon, doped with boron (B) (in the case of the p-doped electrode) and with arsenic (As) or phosphorous (P) (in the case of the n-doped electrode), respectively. The area where the electrodes overlap, that is, where the beam 21 overlaps the underlying electrode 1, is an intrinsic MEMS resonator area, which has a width W and a length L. When an electrical signal is applied over the electrodes, the resonator generates a resonance signal at its resonance frequency: the electrical signal induces a mechanical vibration of the beam part 21, which starts to oscillate vertically, at its mechanical resonance frequency. This causes the capacitance of the electrode arrangement to change, whereby the system generates an electrical resonance signal. Due to the different polarity of the doping of the two electrodes, an increased output current is obtained, if compared to a conventional resonator operating under equivalent conditions.

FIGS. 5A-5E schematically illustrate one possible way of manufacturing a resonator in accordance with an embodiment of the invention. Basically, the fabrication process is based on standard bulk CMOS technology, suitable for integrating the resonator into an integrated circuit.

Figure 5A:
FIGS. 5A-5E: schematic illustrations in cross section of the resonator, during different steps of a manufacturing process.

FIG. 5A illustrates a structure obtained after a first step, in which a substrate wafer is provided, constituting a first silicon layer 501 (for instance, p or n type doped silicon), on which a first insulating or dielectric layer (such as a layer of silicon dioxide ($SiO_2$), also known as a field oxide layer) has been deposited, by thermal oxidization. The thickness of the dielectric layer 502 is typically around 10000 Å.

Figure 5B:
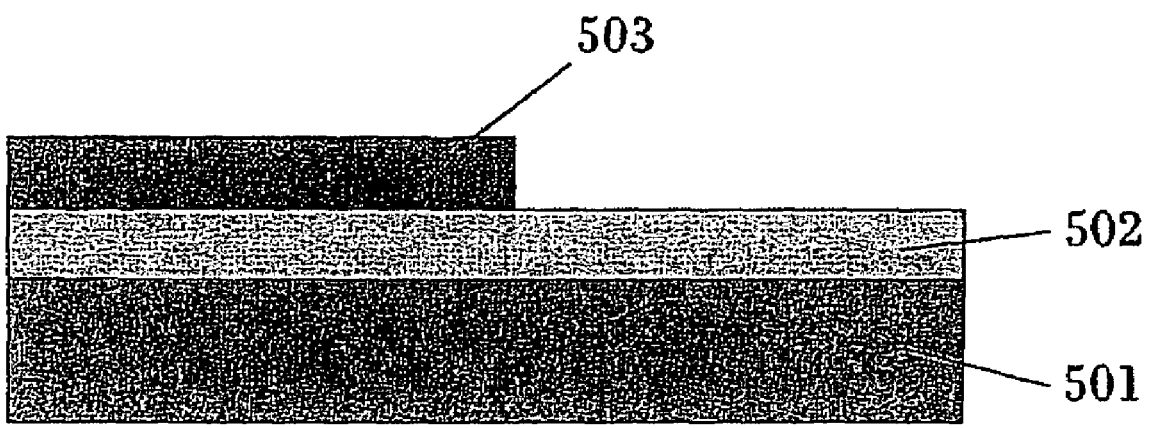

In FIG. 5B, a first polysilicon layer 503 has been deposited on part of the first dielectric layer 502, by CVD (Chemical Vapor Deposition). This first polysilicon layer is doped (for example, by p-type doping with boron (B), or by n-type doping with arsenic (As) or Phosphorous (P)), in order to reduce the resistivity of the polysilicon layer, by thermal diffusion or ion implantation. The wafer is then thermally annealed so as to maintain the uniformity of the doping. The thickness of this first polysilicon layer 503 is typically around 5000 Å (although the width of this layer is not important for this resonator fabrication process as, in this case, this first polysilicon layer will constitute the first electrode, which is not intended to vibrate, wherefore its dimensions are not particularly relevant).

Figure 5C:
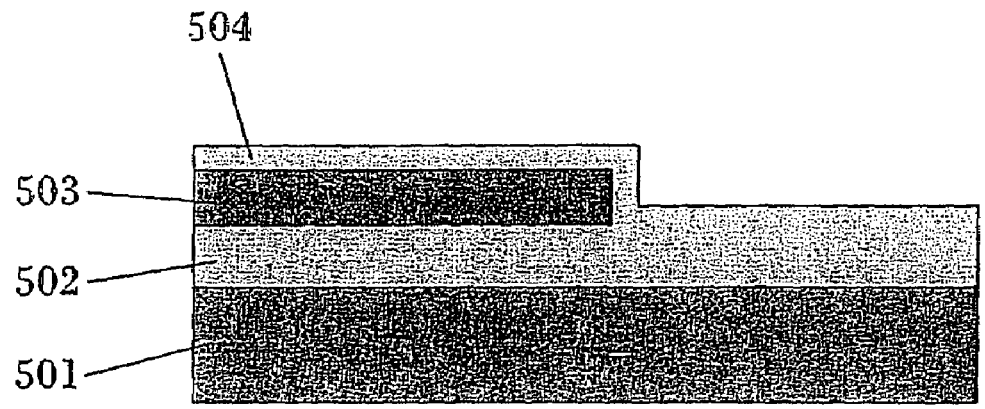

In FIG. 5C, a second dielectric (such as a silicon dioxide ($SiO_2$)) layer 504 has been added by thermal oxidization, in order to insulate the first polysilicon layer 503 from a subsequent polysilicon layer. Also, this second dielectric layer 504 acts as a general support or "anchor" part of the resonator. The thickness of this second dielectric layer 504 depends on the gap to be provided between the vertically overlapping parts of the resonator. Typically, the second dielectric layer can have a thickness less than 500 nm.

Figure 5D:
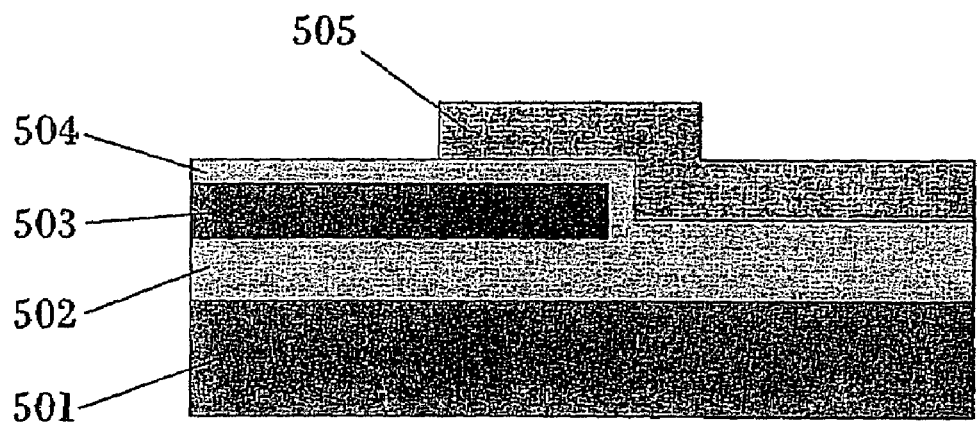
Figure 5E:
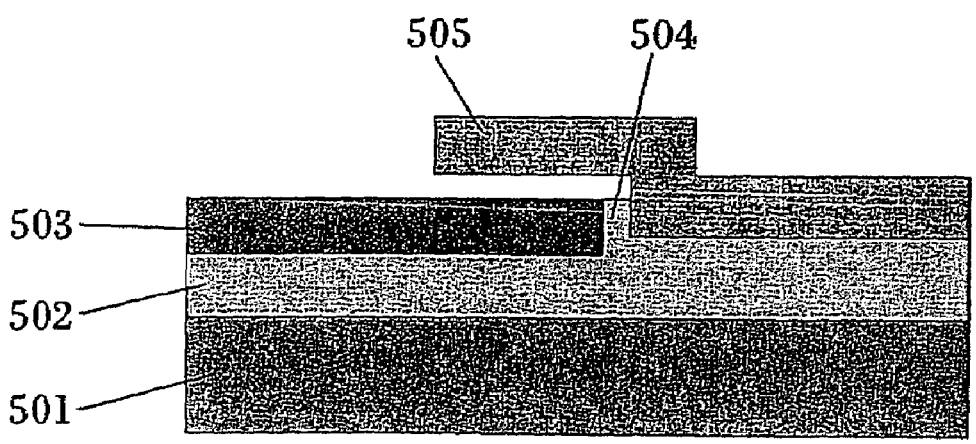

In FIG. 5D, a second polysilicon layer 505 has been deposited on part of the second dielectric layer 504, by CVD. This second polysilicon layer 505 is doped (for example, by p-type doping with boron (B), or by n-type doping with arsenic (As) or phosphorous (P)), in order to reduce the resistivity of the polysilicon layer, by thermal diffusion or ion implantation.

In accordance with the principles of the invention, the doping of this second polysilicon layer will depend on the type of doping of the first polysilicon layer: if the first polysilicon layer (503) was doped with p-type doping, the second polysilicon layer will be doped with n-type doping, and vice versa. That is, one of the polysilicon layers can be doped with As or P, and the other one with B.

The wafer is then annealed so as to maintain the uniformity of the doping. The thickness of this second polysilicon layer 505 is selected in accordance with the desired characteristics of the resonator (the thickness of this layer is an important parameter which strongly influences the resonator characteristics). Typically, the second polysilicon layer can have a thickness between 500 nm and 2000 nm (however, thick polysilicon layers can be more difficult to fabricate and not compatible with standard CMOS manufacturing processes).

In a subsequent step, the so-called "post process" step, the sacrificial layer (namely, part of the second dielectric layer 504) is removed in order to activate the resonator, by means of letting the beam part (corresponding to a part of the second polysilicon layer 505) become free, except for where it is connected to the support part, also constituted by the second polysilicon layer 505. Post process release etching can be done using a hydrofluoric acid release solution (this solution is typically used for removing a silicon dioxide sacrificial layer). The etching time depends on the length of the second dielectric layer 504 that is to be removed. The result of this process can be observed in FIG. 5E.

Figure 6:
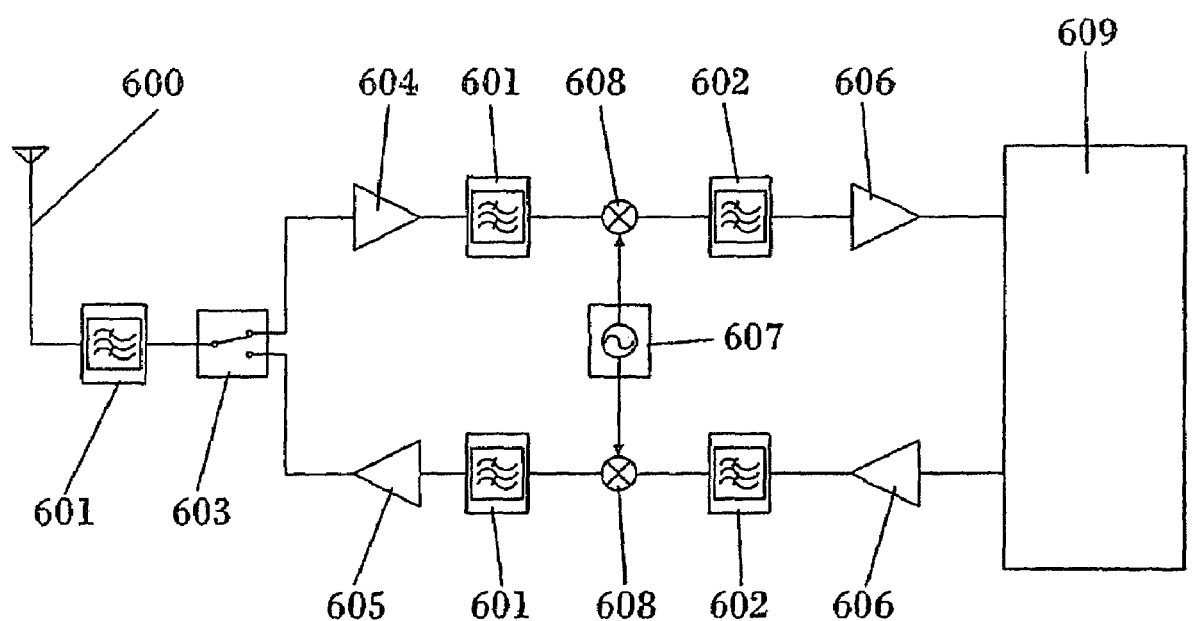
FIG. 6: a schematic illustration of a circuit for a radio frequency application, including resonators according to the invention.

FIG. 6 shows an integrated circuit for a radio frequency application, namely, a transceiver module connected to an antenna 600. The transceiver module comprises a plurality of band-pass filters 601, intermediate frequency band-pass filters 602, an Rx/Tx switch 603, a low noise amplifier 604, a power amplifier 605, intermediate frequency amplifiers 606, a local oscillator 607, frequency conversion mixers 608 and a base band block 609. This circuit configuration is conventional in this kind of applications. However, in accordance with the invention, one or more of the band-pass filters (601, 602) and the local oscillator can be based on resonators in accordance with the invention, integrated in a circuit comprising the other elements, optionally even the antenna 600.

Figure 7A:
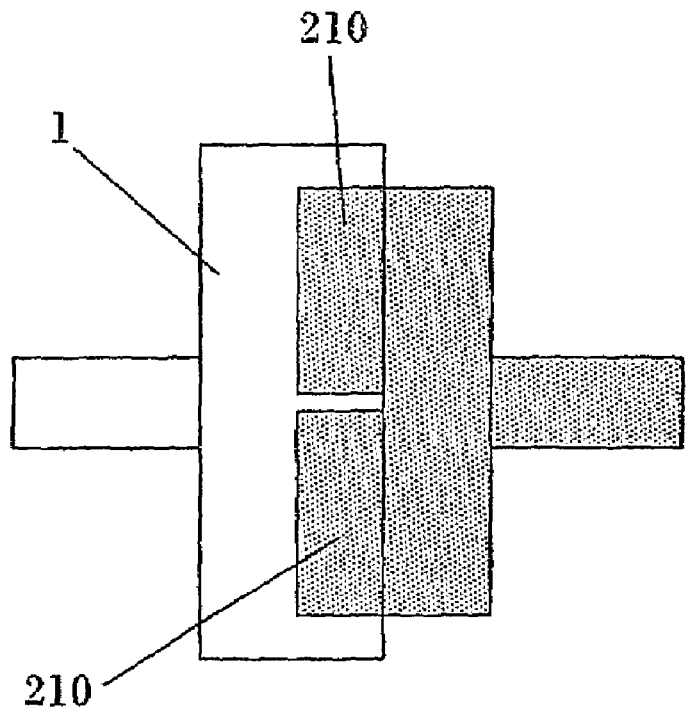
FIGS. 7A and 7B: top views of a MEMS resonators in accordance with alternative embodiments of the invention.
Figure 7B:
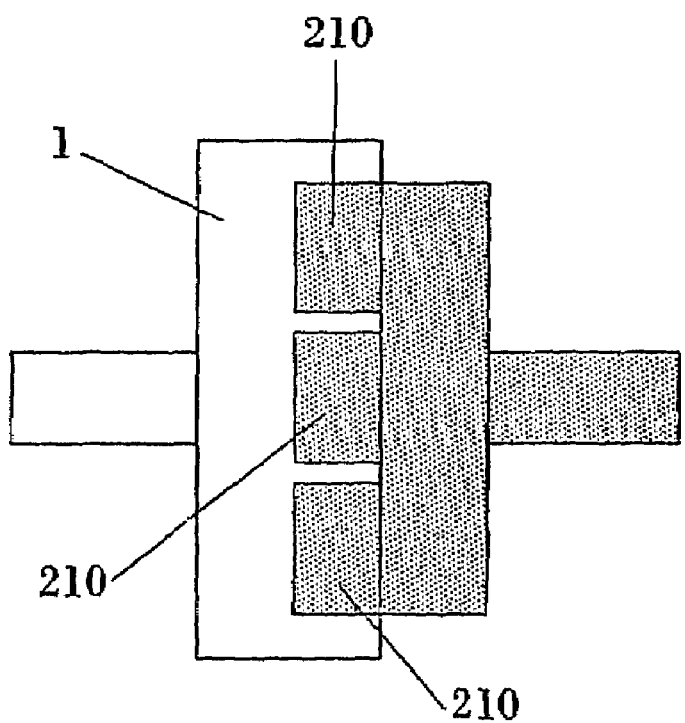

FIGS. 7A and 7B schematically illustrate MEMS resonators in accordance with alternative embodiments of the invention, in which the single beam part 21 of the embodiment of FIGS. 3 and 4 has been replaced by two (FIG. 7A) and three (FIG. 7B) beam parts 210 arranged in parallel. The arrangement in parallel of a plurality of beam parts can help to further increase the output signal, especially if all the beam parts have substantially or exactly the same shape.

In this text, the term "comprises" and its derivations (such as "comprising", etc.) should not be understood in an excluding sense, that is, these terms should not be interpreted as excluding the possibility that what is described and defined may include further elements, steps, etc.

On the other hand, the invention is obviously not limited to the specific embodiment(s) described herein, but also encompasses any variations that may be considered by any person skilled in the art (for example, as regards the choice of materials, dimensions, components, configuration, etc.), within the general scope of the invention as defined in the claims.

The invention claimed is:

1. A resonator, comprising:
   a silicon layer;
   a dielectric layer on the silicon layer;
   a first electrode on the dielectric layer; and
   a second electrode on the dielectric layer, the second electrode being capacitively coupled to the first electrode;
   wherein the first electrode is made of a p-type doped semiconductor material;
   the second electrode is made of an n-type doped semiconductor material, and
   the dielectric layer separates the first and second electrodes from the silicon layer.

* * * * *